United States Patent [19]
Kosuga

[11] Patent Number: 5,140,705
[45] Date of Patent: Aug. 18, 1992

[54] CENTER-TAPPED COIL-BASED RF TANK CIRCUIT FOR A BALANCED MIXER CIRCUIT

[75] Inventor: Tadashi Kosuga, Saitama, Japan

[73] Assignee: Pioneer Electronic Corporation, Tokyo, Japan

[21] Appl. No.: 537,958

[22] Filed: Jun. 13, 1990

[30] Foreign Application Priority Data

Nov. 20, 1989 [JP] Japan .................. 1-299652

[51] Int. Cl.$^5$ .................................. H04B 1/26
[52] U.S. Cl. .................................. 455/318; 455/319; 455/326
[58] Field of Search .............. 455/318, 319, 325, 326, 455/327, 329, 330, 193, 197; 332/138

[56] References Cited

U.S. PATENT DOCUMENTS

| | | | |
|---|---|---|---|
| 2,296,103 | 9/1942 | Kimball | 455/197 |
| 4,080,573 | 3/1978 | Howell | 455/326 |
| 4,339,827 | 7/1982 | Torres et al. | 455/193 |
| 4,449,245 | 5/1984 | Rabe | 455/319 |
| 4,541,124 | 9/1985 | Lacour et al. | 455/327 |
| 4,955,085 | 9/1990 | Woody | 455/323 |
| 5,034,994 | 7/1991 | Muterspaugh et al. | 455/32 C |

FOREIGN PATENT DOCUMENTS 938591 10/1963 United Kingdom .

*Primary Examiner*—Reinhard J. Eisenzopf
*Assistant Examiner*—Edward Urban
*Attorney, Agent, or Firm*—Sughrue, Mion, Zinn, Macpeak & Seas

[57] ABSTRACT

An RF tank circuit includes a coil with a center tap, the RF tank circuit being for receving an input RF signal, and for providing a balanced mixer circuit by being arranged in one of: a) receiving a local signal through second and third capacitors at first and second coil ends, respectively, with the center tap grounded; and, b) receiving a local signal at the center tap. An impedance is connected between the first and second coil ends of the RF tank circuit, the impedance providing low impendance for a predetermined intermediate frequency signal, and high impedance for a predetermined high frequency signal and a local signal. A bias resistor is connected between a middle connecting point of the impedance and ground. The coil of the RF tank cicuit can be one of a primary and second winding of an isolation transformer, with a remaining one of the primary and secondary windings being connected to an RF signal source, the isolation transformer being for preventing a leakage of a local signal to the RF signal source.

3 Claims, 2 Drawing Sheets

CENTER-TAPPED COIL-BASED RF TANK CIRCUIT FOR A BALANCED MIXER CIRCUIT

FIELD OF THE INVENTION

This invention relates to a balanced mixer circuit which does not require a hybrid transformer.

BACKGROUND OF THE INVENTION

A signal receiver may have a front end which includes a hybrid transformer to convert an unbalanced input RF signal into a balanced output, and to inject a local signal into the input RF signal.

One example of a hybrid transformer arrangement is as shown in FIG. 4. In FIG. 4, reference character $e_i$ designates an input RF (radio frequency) signal source providing an RF signal. The RF signal is applied through a capacitor $C_1$ to an RF tank circuit 1 consisting of a coil $L_1$ and a capacitor $C_2$, and then through a capacitor $C_3$ to an input terminal $I_1$ of a hybrid transformer 2 serving as a balun.

The RF signal applied to the hybrid transformer 2 is of an unbalanced input type. Another input terminal $I_2$ of the hybrid transformer 2 is grounded through a parallel circuit consisting of a resistor $R_1$ and a capacitor $C_4$. A local signal oscillator 3 outputs a local signal $L_0$, which is applied through a capacitor $C_5$ to a predetermined internal circuit connecting point $P_1$ of the transformer 2. As shown in FIG. 4, the circuit connecting point $P_1$ is connected to the connecting point of two windings which are series-connected between the input terminals $I_1$ and $I_2$.

Impedance means 4 (or coil $L_2$) is connected between the balanced output terminals $O_1$ and $O_2$ of the hybrid transformer. The impedance means 4 provides low impedance for an IF (intermediate frequency) signal, and high impedance for the above-described RF signal and local signal.

The balanced output terminals $O_1$ and $O_2$ of the transformer 2 are connected to the sources of FETs $Q_1$ and $Q_2$, respectively. The drains of the FETs are connected to a tuning circuit 5, and gates are grounded.

The tuning circuit 5 is a parallel circuit of a capacitor $C_6$ and a coil $L_3$, which is tuned to the IF signal. The coil $L_3$ is electromagnetically coupled to a coil $L_4$. The signal induced on the coil $L_4$ is provided, as an IF output, at an output terminal IFout.

A supply voltage +B is applied to the center tap of the coil $L_3$, serving as an operating voltage for the FETs $Q_1$ and $Q_2$ forming a mixer circuit. The center tap, to which the supply voltage +B is applied, is grounded through a bypass capacitor $C_7$.

In the above-described device, the input RF signal is mixed with the local signal, so that the difference in frequency between those two signals is extracted by the tuning circuit, thus providing an IF signal.

In the above-described device, the hybrid transformer is employed to provide a balanced mixer circuit. For use in a VHF or UHF band, the hybrid transformer must be of a transmission line type hybrid using a ferrite core. The hybrid transformer of this type is intricate in construction and high in manufacturing cost because it is formed by winding a pair of windings on a so-called "eye core".

SUMMARY OF THE INVENTION

An object of this invention is to eliminate the above-described difficulties accompanying the above-described arrangement. More specifically, an object of the invention is to provide a balanced mixer circuit which, as a result of eliminating the hybrid transformer, is low in manufacturing cost and small in size or occupied volume.

The above-described object of the invention has been achieved by the provision of a balanced mixer circuit in which, according to the invention, a parallel resonance coil forming an RF tank circuit has a center tap, and with the center tap grounded: a local signal is applied to the balanced output terminals of the tank circuit, respectively, through capacitors; or the local signal is applied to the center tap of the parallel resonance coil forming the tank circuit, so that the outputs of the RF tank circuit are balanced.

DETAILED DESCRIPTION OF THE PREFERRED EMBODIMENTS OF THE INVENTION

Figure 4:
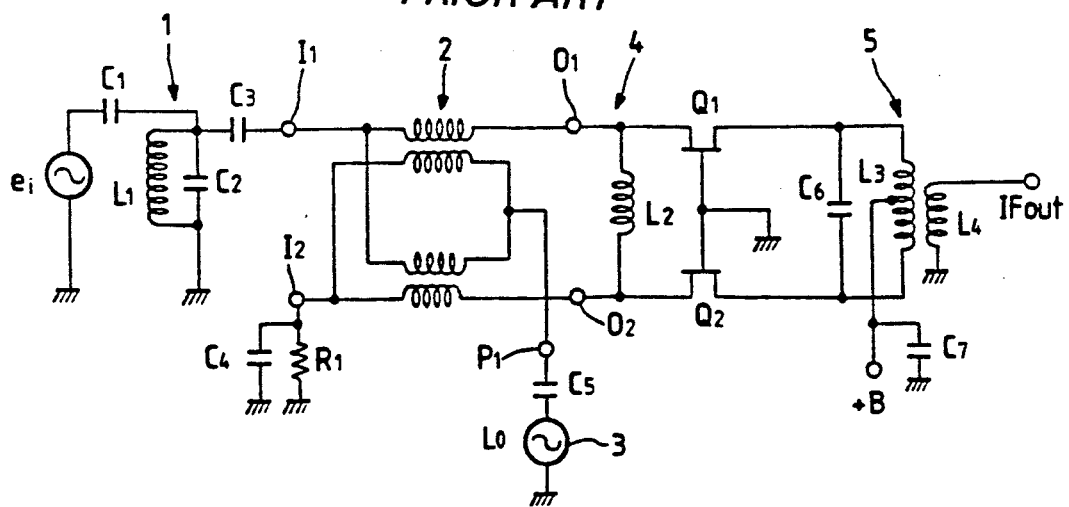
FIG. 4 is a circuit diagram showing a balanced mixer circuit having a hybrid transformer.

Preferred embodiments of the invention will be described with reference to the accompanying drawings. Those components which have been previously described with reference to FIG. 4 are designated by the same reference numerals or characters.

Figure 1:
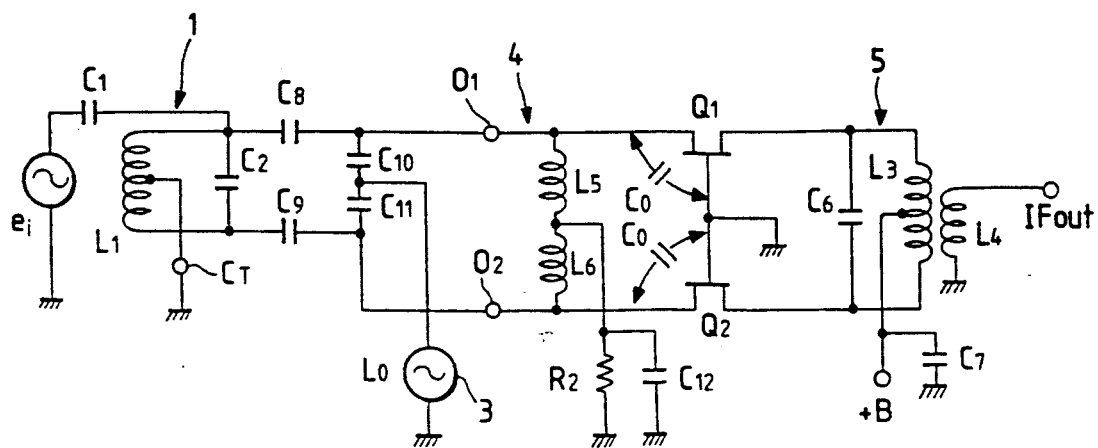
FIG. 1 is a circuit diagram showing a first embodiment of the invention.

FIG. 1 shows a first embodiment of the invention, wherein an RF tank circuit 1 consisting of a coil $L_1$ and capacitor $C_2$ has a center tap $C_T$ which is grounded. First and second ends of the coil $L_1$ are connected to first terminals of capacitors $C_8$ and $C_9$, respectively, and the remaining terminals of capacitors $C_8$ and $C_9$ are the balanced output terminals $O_1$ and $O_2$ of the RF tank circuit.

The local signal oscillator 3 applies the local signal $L_0$ to the balanced output terminals $O_1$ and $O_2$, respectively, through capacitors $C_{10}$ and $C_{11}$ which provide additional capacitance for the RF tank circuit.

The impedance means 4, which provides low impedance for the IF signal and high impedance for the RF signal and the local signal, is divided into two coils $L_5$ and $L_6$, and forms a resonance circuit with the distributed capacitances $C_0$ provided between the sources and gates of the FETs $Q_1$ and $Q_2$.

The connecting point of the coils $L_5$ and $L_6$ is grounded through a parallel circuit of a bias resistor $R_2$ and a bypass capacitor $C_{12}$.

The IF tuning circuit operates fundamentally in cooperation with the above-described capacitor $C_6$, coil $L_6$ and distributed capacitances $C_0$.

In the first embodiment thus organized, the RF tank circuit (with the center tap grounded) provides the input RF signal to the balanced output terminals $O_1$ and $O_2$, and the switching elements (FETs $Q_1$ and $Q_2$) perform a switching operation with the aid of the local signal applied to the balanced output terminals $O_1$ and $O_2$, so that the IF signal is extracted by the tuning circuit 5.

Figure 2:
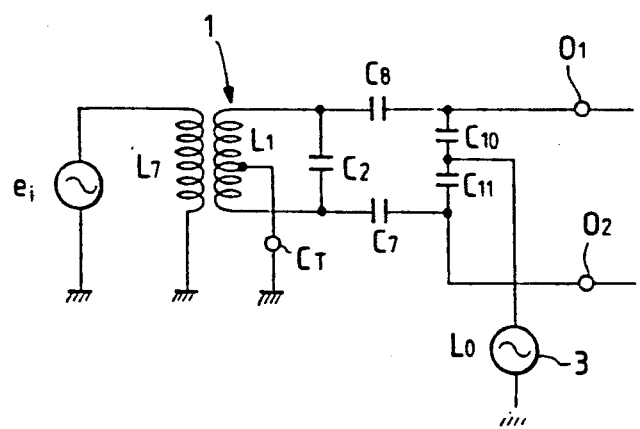
FIG. 2 is a circuit diagram showing a part of a second embodiment of the invention.

FIG. 2 shows a second embodiment of the invention. In the second embodiment, a primary winding $L_7$ is electromagnetically coupled to the coil $L_1$ forming the RF tank circuit 1. In the second embodiment, leakage of the local signal to the RF signal source $e_i$ (i.e., to the antenna side) can be prevented.

Figure 3:
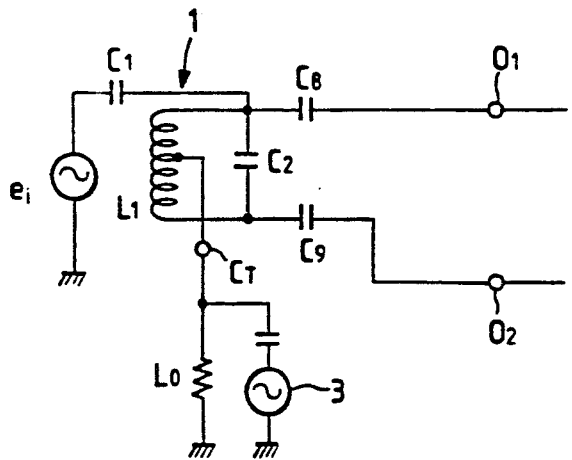
FIG. 3 is a circuit diagram showing a part of a third embodiment of the invention.

FIG. 3 shows a third embodiment of the invention. In the third embodiment, the local signal oscillator 3 applies the local signal to the center tap $C_T$ of the coil $L_1$ forming the RF tank circuit 1. In the third embodiment, also, the RF tank circuit 1 provides the balanced output terminals $O_1$ and $O_2$, and the FETs $Q_1$ and $Q_2$ perform a switching operation with the aid of the local signal applied to the RF tank circuit, so that the IF signal is extracted by the tuning circuit 5.

As is apparent from the above description, according to the invention, the resonance coil forming the RF tank circuit has a center tap, and the local signal is applied to both ends of the coil with the center tap grounded, or the local signal is applied to the center tap, so that the mixer circuit is in balance. Thus, the invention has eliminated use of the previously-described hybrid circuit formed by winding a pair of windings on an eye core.

Hence, the balanced mixer circuit according to the invention is low in manufacturing cost and small in size or occupied volume.

What is claimed is:

1. A balanced mixer circuit comprising:

RF tank circuit means including coil means with a center tap grounded, and first capacitor means connected between first and second ends of said coil means;

local signal oscillator means connected to said first and second ends of said RF tank circuit means, respectively, through second and third capacitor means;

impedance means connected between said first and second ends of said RF tank circuit means, said impedance means providing low impedance for a predetermined intermediate frequency signal, and high impedance for a predetermined high frequency signal and a local signal;

bias resistor means connected between a middle connecting point of said impedance means and ground;

first and second switching means connected, respectively, to said first and second ends of said RF tank circuit means, for receiving said local signal and performing a switching operation in accordance with said local signal;

tuning means connected to said first and second switching means, said tuning means being tuned to derive an intermediate frequency signal from outputs of said first and second switching means.

2. A circuit as claimed in claim 1, wherein said coil means of said RF tank circuit means is one of a primary and secondary winding of an isolation transformer, with a remaining one of said primary and secondary windings being connected to an RF signal source, said isolation transformer being for preventing a leakage of said local signal to said RF signal source.

3. A balanced mixer circuit comprising:

RF tank circuit means including coil means with a center tap to which a local signal is applied, and first capacitor means connected between first and second ends of said coil;

impedance means connected between said first and second ends of said RF tank circuit means, said impedance means providing low impedance for a predetermined intermediate frequency signal, and high impedance for a predetermined high frequency signal and said local signal;

bias resistor means connected between a middle connecting point of said impedance means and ground;

first and second switching means connected, respectively, to said first and second ends of said RF tank circuit means, for receiving said local signal and performing a switching operation in accordance with said local signal;

tuning means connected to said first and second switching means, said tuning means being tuned to derive an intermediate frequency signal from outputs of said first and second switching means.

* * * * *